(12) United States Patent
Dutta

(10) Patent No.: US 10,020,413 B2
(45) Date of Patent: Jul. 10, 2018

(54) FABRICATION OF A LOCAL CONCENTRATOR SYSTEM

(75) Inventor: Partha Dutta, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 818 days.

(21) Appl. No.: 12/452,496

(22) PCT Filed: Jul. 3, 2008

(86) PCT No.: PCT/US2008/008246
§ 371 (c)(1),
(2), (4) Date: Jan. 5, 2010

(87) PCT Pub. No.: WO2009/008996
PCT Pub. Date: Jan. 15, 2009

(65) Prior Publication Data
US 2010/0132763 A1    Jun. 3, 2010

Related U.S. Application Data

(60) Provisional application No. 60/948,260, filed on Jul. 6, 2007.

(51) Int. Cl.
*H01L 31/042* (2014.01)
*H01L 31/052* (2014.01)
*H01L 31/054* (2014.01)

(52) U.S. Cl.
CPC ........ *H01L 31/052* (2013.01); *H01L 31/0543* (2014.12); *H01L 31/0547* (2014.12); *Y02E 10/52* (2013.01)

(58) Field of Classification Search
CPC .......... H01L 31/0232; H01L 31/02327; Y02E 10/52; Y02E 10/50
USPC ......................................................... 136/246
See application file for complete search history.

(56) References Cited

U.S. PATENT DOCUMENTS

| | | | | |
|---|---|---|---|---|
| 4,140,142 | A | * | 2/1979 | Dormidontov et al. ...... 136/246 |
| 4,473,065 | A | * | 9/1984 | Bates .......................... F24J 2/07 |
| | | | | 126/635 |
| 4,592,129 | A | * | 6/1986 | Legge .............................. 438/72 |
| 5,419,782 | A | * | 5/1995 | Levine et al. ................. 136/246 |
| 6,363,928 | B1 | | 4/2002 | Anderson, Jr. |
| 6,653,551 | B2 | | 11/2003 | Chen |
| 2005/0081908 | A1 | | 4/2005 | Stewart |
| 2006/0137733 | A1 | * | 6/2006 | Schripsema et al. ......... 136/246 |
| 2006/0185713 | A1 | * | 8/2006 | Mook, Jr. ..................... 136/244 |
| 2007/0107770 | A1 | | 5/2007 | Rust |

OTHER PUBLICATIONS

International Search Report and Written Opinion dated Jan. 28, 2009, in PCCT/US2008/008246), 12 pages.

* cited by examiner

*Primary Examiner* — Shannon M Gardner
(74) *Attorney, Agent, or Firm* — Foley & Lardner LLP

(57) ABSTRACT

A local concentrator apparatus is described. The apparatus includes an array of photovoltaic cells arranged along an elongated strip, and one or more optical elements. The one or more optical elements are arranged to direct and optically concentrate sunlight onto the photovoltaic cells such that position that the directed sunlight impinges onto the strip follows a path moving along the strip without the optical elements tracking the sun as the sun traverses the sky during the day.

27 Claims, 7 Drawing Sheets

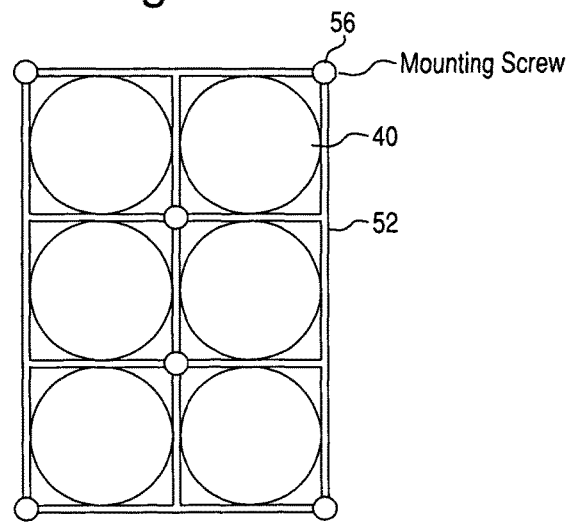
Fig. 3B
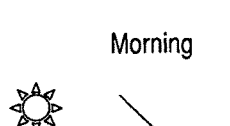
Fig. 4A
Morning
Fig. 4B
Noon
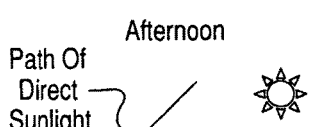
Fig. 4C
Afternoon
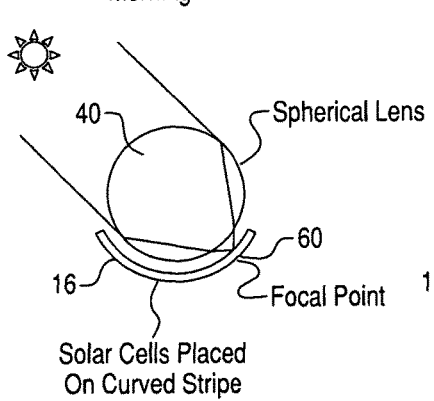
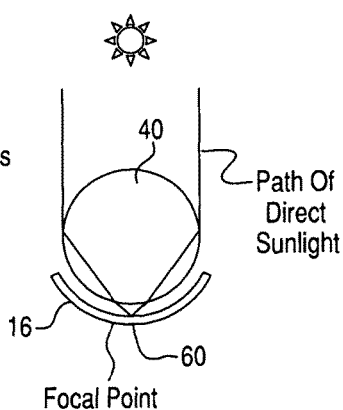
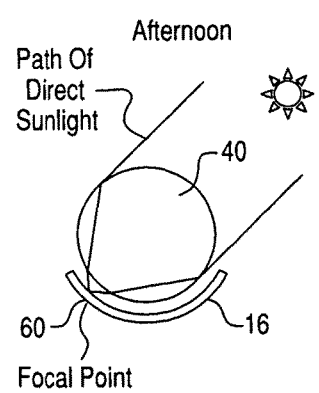

FABRICATION OF A LOCAL CONCENTRATOR SYSTEM

CROSS-REFERENCE TO RELATED PATENT APPLICATIONS

This application is a National Stage application of PCT/US2008/008246, filed Jul. 3, 2008, which claims priority to U.S. Provisional Application 60/948,260 filed on Jul. 6, 2007, which are incorporated by reference in their entirety.

BACKGROUND OF THE INVENTION

Field of the Invention

The present invention relates to the area of solar energy, and more particularly to a design and fabrication of a high efficiency, low cost, local concentrator type solar photovoltaic (PV) panel and a local concentrator panel.

Description of Related Art

It is well known that for PV technology to be viable for wide-spread adoption, there are two primary requirements: cell efficiency of at least 20% and the total system cost enabling a pay-back time of a few months to a couple of years. Unfortunately, most PV technology has problems with either one or both of these requirements.

SUMMARY OF THE INVENTION

One object of the invention is to enable the fabrication of high efficiency solar photovoltaic systems that are cost effective for wide-spread house-hold and industrial applications.

One way to reduce the cost of a PV system is to reduce the total area of semiconductor devices (PV cells). This is possible by using optical concentrators such as parabolic mirrors or lenses to focus the sunlight onto a smaller area (focal point) where the PV cell is placed. Concentration ratios as high as 1000 times (1000 Suns) have been achieved. The usage of concentration also helps in boosting the spectral power density. However there are a few problems that need to be addressed for concentrator technology: (a) active cell cooling becomes absolutely necessary due to higher temperatures by power concentration and (b) the entire concentrator module needs to be continuously rotated during the day to track and face the sun as it traverses the sky during the day. If the concentrator is not rotated, there is a spike in the power around noon and the power generated before noon and afternoon are significantly less than the non-concentrator based systems.

This latter problem is a significant one, since solar concentrators are required to track the movement of the sun, this decreases the efficiency of the system since it can only collect light from a particular angle at any one time. Furthermore the requirement of tracking the sun increases the costs of manufacture significantly.

The usage of a local light concentrator helps to reduce PV cell area which leads to significant reduction in systems cost. Unlike traditional concentrator type PV systems, the proposed system need not be continuously rotated to face the sun during the day, and thus tracking is not necessary. The employment of light concentrator in form of spherical lenses, hemispherical lenses, conical reflectors, or parabolic reflectors, for example, in conjunction with a linear array of PV cells placed such that the focal point of the light concentrator moves along the linear array eliminates the need for the solar power panel to face (track) the sun. Furthermore, by employing double sided and edge exposed PV cell configurations, illumination from top, bottom as well as the edge of the cell enables a better light capturing process enhancing the overall power conversion efficiency of the system as compared to an existing non-concentrator type flat solar panel. By optimizing the concentration ratios depending on geographical location of the solar panel, one can eliminate the need for active cooling of the PV devices during operation.

According to one embodiment of the invention, there is provided an apparatus. The apparatus comprises: an array of photovoltaic cells arranged along an elongated strip; and one or more optical elements arranged to direct and optically concentrate sunlight onto the photovoltaic cells such that position that the directed sunlight impinges onto the strip follows a path moving along the strip without the optical elements tracking the sun as the sun traverses the sky during the day.

According to one embodiment of the invention, there is provided an apparatus. The apparatus comprises: an array of photovoltaic cells arranged along an elongated strip; and one or more spherical lens arranged to direct and optically concentrate sunlight onto the photovoltaic cells such that position that the directed sunlight impinges onto the strip follows a path moving along the strip as the sun traverses the sky during the day According to another embodiment of the invention, there is provided an apparatus for collecting solar energy. The apparatus comprises an array of spherical concentrators held by a grid mesh and positioned above an array of photovoltaic cells and heat sinks. The spherical concentrators allow light to be concentrated independent of the angle from which it enters, thus making tracking of the sun unnecessary. Furthermore, the array of spherical concentrators can be arranged above any desired arrangement or design of PV cells, thus making the resulting apparatus modular in design. The spherical concentrators can also be composed of a variety of transparent materials including glass and plastic. The size of the spherical concentrators will only be limited by the amount of heat dissipation needed in the specific application.

BRIEF DESCRIPTION OF THE DRAWINGS

FIGS. 3A and 3B are side cross section and top views, respectively, of a local concentrator apparatus with spherical lenses according to an embodiment of the invention.

FIGS. 4A, 4B and 4C are schematics illustrating the concept of the local concentration of sunlight using spherical lens for morning, noon, and afternoon, respectively, according to an embodiment of the invention.

DETAILED DESCRIPTION OF THE PREFERRED EMBODIMENTS

In the following detailed description of various embodiments, reference is made to the accompanying drawings that form a part hereof, and in which are shown by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. Examples and embodiments merely typify possible variations. Individual components and functions are optional unless explicitly required, and the sequence of operations may vary. Portions and features of some embodiments may be included in or substituted for those of others. The following description is, therefore, not to be taken in a limiting sense.

Figure 1:
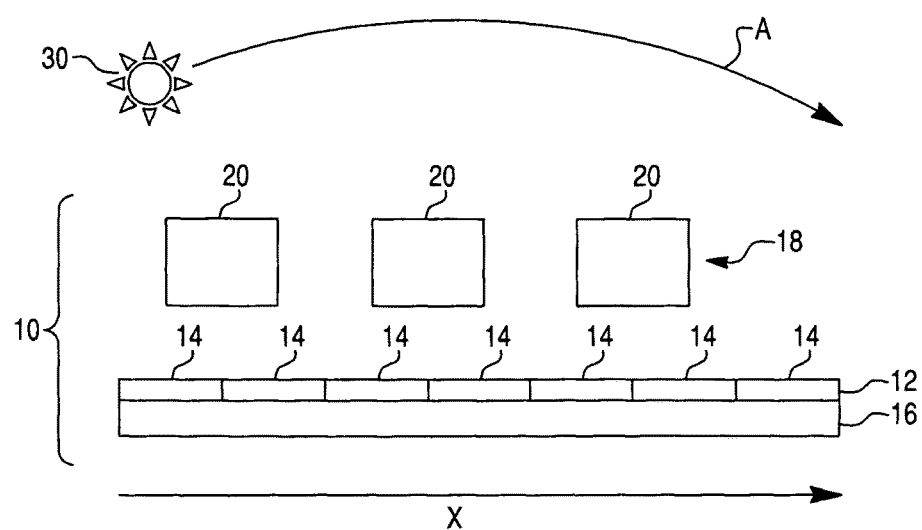
FIG. 1 is a schematic illustrating a local concentrator apparatus according to an embodiment of the invention.

FIG. 1 illustrates in schematic form a local concentrator solar panel apparatus 10 according to one embodiment of the invention. The apparatus 10 includes an array 12 of PV cells 14 arranged along an elongated strip 16. The apparatus further comprises one or more optical elements 20, such as an array 18 of optical elements 20, which act as local concentrators. The array of optical elements 20 is arranged to direct and optically concentrate sunlight from the sun 30 onto the PV cells 14 such that the position that the directed sunlight impinges onto the cells 14 on the strip 16 follows a path moving along the strip without the optical elements 20 tracking the sun 30 as the sun traverses the sky during the day. As shown in FIG. 1, the sun traverses the sky along the path A as shown. The path of the directed sunlight on the cells 14 on the strip 16 is in the x direction, or opposite to the x direction, as shown in FIG. 1, where the x-direction is the direction along which the array 12 on the strip 16 is oriented. The path of the directed sunlight on the cells 14 on the strip 16 is preferably continuous as shown in FIG. 1, and the cells 14 are preferably arranged in a continuous manner on the strip. Preferably the cells 14 in each strip 16 are electrically connected in series, and each strip 16 has a separate electrical connection. Preferably, the one or more optical elements 20 correspond to one strip 16 such that the optical elements 20 allow the rays to be scanned from one end of the strip to an opposite end. The one or more optical elements 20 may be cylindrical lenses, spherical lenses, hemi-spherical lenses, parabolic mirrors, or conical mirrors, for example.

The array of optical elements 20 may be arranged to direct and optically concentrate sunlight from the sun 30 onto the PV cells 14 such that the position that the directed sunlight impinges onto the cells 14 on the strip 16 follows a path moving along the strip without the optical elements 20 tracking the sun 30 as the sun traverses the sky during the day, for only a portion of the daylight hours, or during the entire daylight hours. The array of optical elements 20 may be arranged to direct and optically concentrate either direct and/or indirect sunlight from the sun 30 onto the PV cells 14. For example, indirect sunlight that is scattered by the sky or reflected off a building may be directed and optically concentrated.

In the case the optical elements 20 are concentrating lenses, such as spherical lenses or hemi-spherical lenses, the concentrating lenses should be made of an appropriate material. The concentrating lenses may be made of a high index of refraction material, for example, where a high index of refraction is an index of refraction greater than about one. The concentrating lenses may be made of glass or plastic, for example. In the case that the concentrating lenses are spherical, the lenses may be glass marbles, for example. The concentrating lenses may comprise hollow spheres of an optically transparent solid filled with a high refractive index liquid. The high refractive index liquid may comprise a material comprising at least one of water, oil, glycerol, acetone, methanol, or another liquid, for example. The optically transparent solid may be glass or plastic, for example.

The concentrating lenses may comprise an optically clear composite solid. The concentrating lenses may comprise a core-shell structure with different refractive indices for the core and shell. The concentrating lenses comprise at least one of a mixture of glass and plastic, high refractive index solid dispersed in liquid, or glass embedded with air bubbles. The concentrating lenses may comprise an anti-reflection coating on the lens surface to reduce sunlight reflection. The concentrating lenses may comprise a structure with multiple layers, each layer having a different refractive index, or a structure having concentric hollow layers filled with liquids having different indices of refraction. The concentrating lenses may comprise a solid transparent high refractive index cylindrical rod, or a hollow cylindrical solid tube filled with liquid.

The PV cells 14 may comprise a single bandgap material such as silicon, germanium, compound semiconductors, such as $Cu(In,Ga)Se_2$, for example, or organic semiconductors, for example. The PV cells 14 may comprise gratzel cells, for example. The PV cells 14 may comprise a multiple bandgap materials.

The elongated strip may have a width and length, as appropriate, and may have a width between about 1 to 5 mm and a length between about 0.5 to 5 cm, for example.

The apparatus 10 is arranged such that the optical elements 20 need not track the sun as the sun traverses the sky. Thus, the orientation of the optical elements, as well as the orientation of the array relative to the sun need not change as the sun traverses the sky. The apparatus of claim 10, while not requiring tracking, still allows that the midday spike in power generation is prevented by providing that the focus point of the sunlight onto the array 12 follows a path along the orientation of the array 12.

Figure 2:
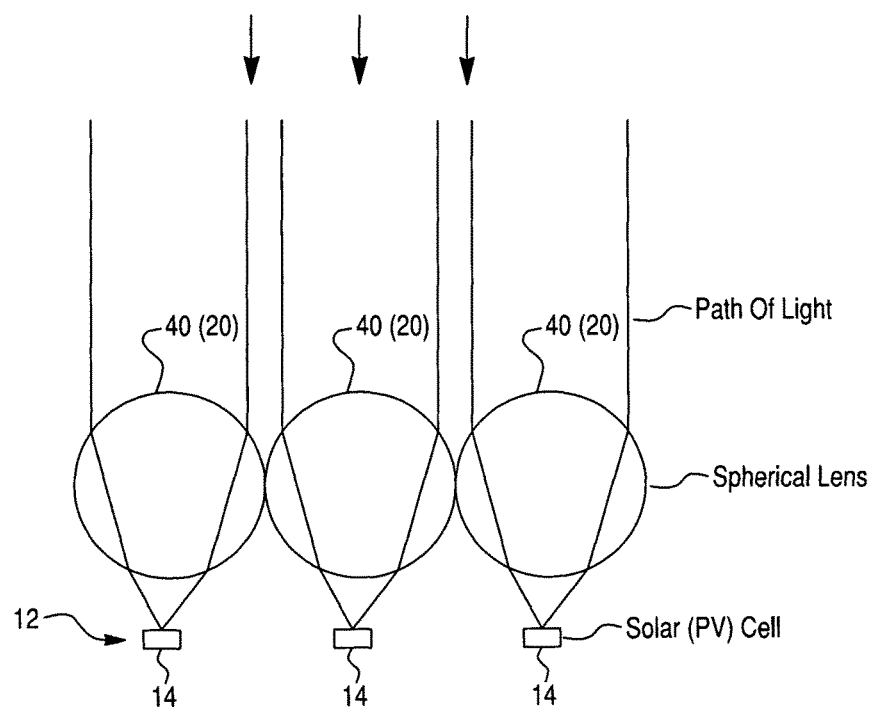
FIG. 2 is a schematic illustrating the concept of local concentration of sunlight according to an embodiment of the invention.

FIG. 2 illustrates the concept of local concentration of sunlight onto PV cells in the case where the optical elements are spherical ball lenses 40. The spherical ball lenses 40 focus light onto the PV cells 14. The concentration ratios can be varied depending on the area of the spherical lenses and the area of the PV cell. The concentration ratio depends on the cross-sectional area covered by the spherical lenses 40 and the area of the PV cell 14 onto which the light is focused. For example, if the cross-sectional area of a spherical lens is 50 times the area of the PV cell onto which the light is focused, the concentration ratio is 50. The path of the parallel light rays from the sun focused onto the focal point (where the cell is placed) through the spherical lens is shown in FIG. 2.

For proof of concept experiments, a concentration ratio of 80 was used with a single PV cell. In the case of a single PV cell with maximum power generation at noon, the amount of PV cell material is reduced by 80 times. On the other hand for a strip with an array of cells mounted thereon, where the concentrated light follows along the strip as the sun traverses the sky, the reduction in PV material usage is approximately 10 times. The spherical lenses 40 were glass lenses and are significantly less expensive than PV cell materials.

Another important point is that the system need not be rotated to track the sun unlike existing concentrator type systems. Foregoing tracking saves a significant amount of PV power and system cost involved with motors and mechanical frames used for tracking. Another advantage of the use of an array of optical elements, such as spherical shaped elements, is that the system is modular in design and can be simply adapted to use with various PV cells, or any other use that requires passive concentration of light without the need for tracking of the sun.

Figure 3A:
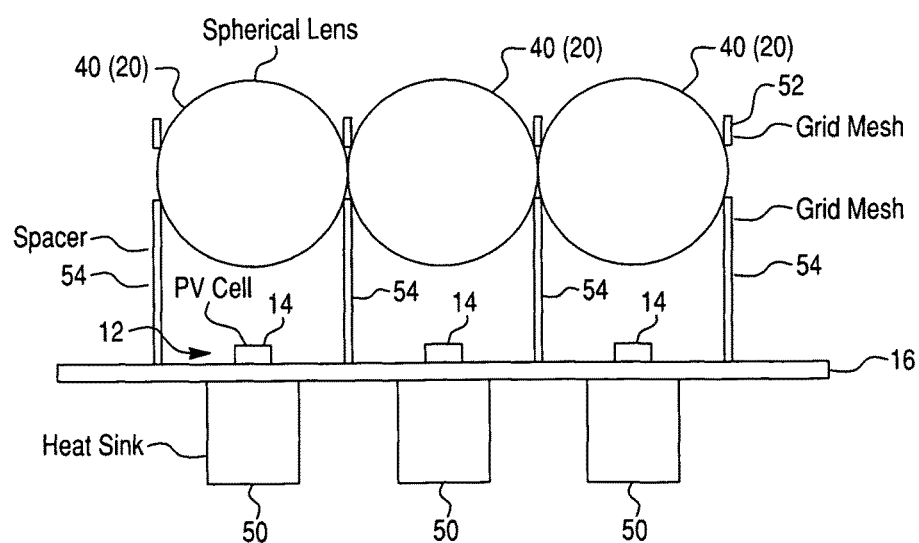

FIGS. 3A and 3B illustrate an embodiment of the local concentrator solar panel apparatus where the optical elements are spherical lens 40 arranged in the array 12 on the strip 16. FIGS. 3A and 3B illustrate a side view and top view, respectively, of the apparatus. This system is extremely easy to manufacture and hence the cost of the overall system will be significantly lower than existing concentrator type PV systems. In general embodiments other than that shown in FIGS. 3A and 3B are also contemplated by the invention.

The apparatus comprises a heat sink or sinks 50 onto which individual cells 14 are mounted. The apparatus includes a grid mesh 52 which functions to support the spherical lenses 40. Spacers 54 are arranged to separate the grid mesh 52 from the underlying strip 16 with cells 14. The grid mesh may be attached to the spacers 54 with nuts and bolts 56. The top surface of the heat sink 50 where the PV cells 14 are mounted could be textured mirrors to reflect any stray radiation onto the edge of the PV cells that are exposed. This allows for the generation of additional power.

For the FIGS. 3A and 3B system with discrete cells 14, preferably the concentration ratio is in the range of about 50-100 times (50-100 suns) where the discrete PV cells 14 may be mounted separately on heat sinks 50 for effective cooling. Thus, the concentration ratio is less than about 100. The availability of the edges of the cell 14 (due to the discrete nature of the cells) in this case also allows sunlight to reach the cells from the sides as well as top of the cells thereby enhancing the light capture and providing higher power generation. This system design provides a high power conversion efficiency photovoltaic concentrator system which is cost-effective for large-scale building integrated or stand-alone applications.

FIGS. 4A, 4B and 4C illustrate the movement of the position of the focal point followed by the focused light from a static spherical lens 40 as the sun 30 traverses the sky during the day. Specifically, FIGS. 4A, 4B and 4C show the position of the sun 30 and focal point 60 on the cells of the strip 16 for morning, noon, and afternoon, respectively. The light is focused along a curved strip 16 where PV cells are placed to avoid the necessity of tracking of the sun. As can be seen, the path of the focal point 60 follows opposite to the x-direction, where the x-direction is along the orientation of the curved strip 16.

Figure 5:
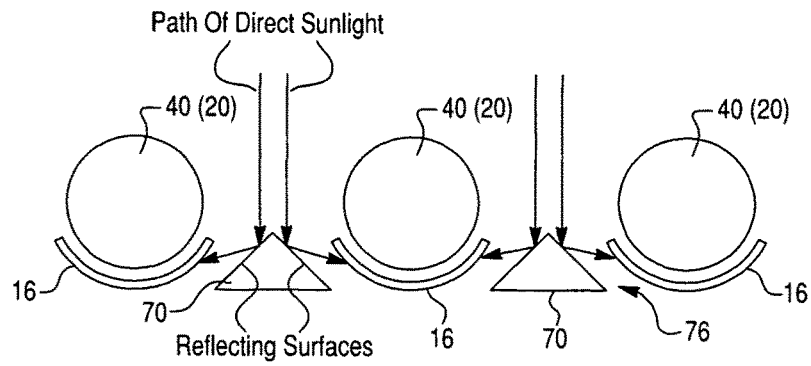
FIG. 5 is a schematic illustrating a local concentrator apparatus with an auxiliary array and spherical lenses according to an embodiment of the invention.

FIG. 5 illustrates an embodiment of the local concentrator apparatus including an auxiliary array 76 of optical elements 70 in addition to the array of optical elements 20, i.e., in this case spherical lenses 40, which direct and concentrate sunlight onto a first side of the array of PV cells on the strip 16. While FIG. 5 illustrates the optical elements 20 to be spherical lenses 40, in general the optical elements may be hemispherical lenses, or other optical elements, for example. The auxiliary array 76 of optical elements 70 is arranged to direct sunlight onto a second side of the array of PV cells, where the second side is opposite to the first side. The optical elements 70 of the auxiliary array 76 may be prism shaped reflecting mirrors, for example, with reflecting surfaces, for example. The sunlight falling on the reflecting surfaces of the optical elements 70 is re-directed to the back side (second side) of the strip. This configuration reduces the area of the PV cells required as compared to a design with a continuous array of spherical lenses. In this embodiment, the strip 16 comprises double sided illumination type PV devices.

Figure 6A:
FIGS. 6A, 6B and 6C are schematics illustrating the concept of the local concentration of sunlight using hemispherical lens for morning, noon, and afternoon, respectively, according to an embodiment of the invention.
Figure 6A:
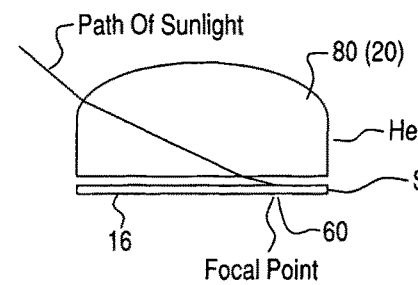
Figure 6B:
Figure 6B:
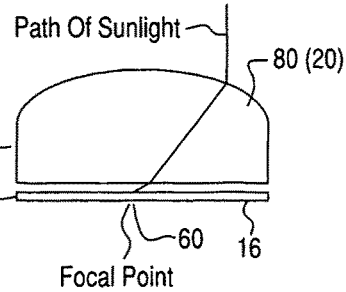
Figure 6C:
Figure 6C:
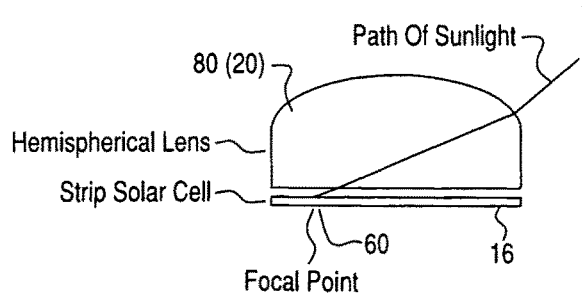

FIGS. 6A, 6B, and 6C illustrate the movement of the position of the focal point followed by the focused light from a static hemispherical lens 80 as the sun 30 traverses the sky during the day. FIGS. 6A, 6B, and 6C show the same concept as in FIGS. 4A, 4B, and 4C where hemispherical lens are employed as the optical elements 20 instead of spherical lenses.

Figure 7:
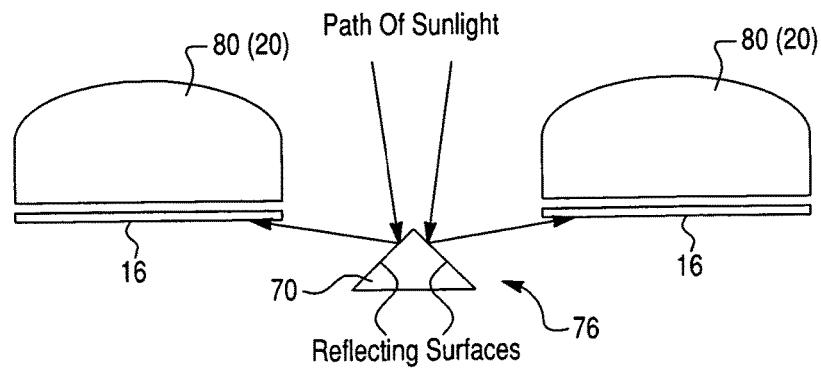
FIG. 7 is a schematic illustrating a local concentrator apparatus with an auxiliary array and hemispherical lenses according to an embodiment of the invention.

FIG. 7 illustrates an embodiment of a portion of a local concentrator apparatus including an auxiliary array 76 of optical elements 70 in addition to the array of optical elements 20. The embodiment of FIG. 7 is similar to that of FIG. 5, except that hemispherical lens 80 are employed as the optical elements 20 instead of spherical lenses 40. FIG. 7 illustrates only a portion of the local concentrator apparatus for the sake of illustration. In general, the apparatus includes a plurality of optical elements 70.

Figure 8:
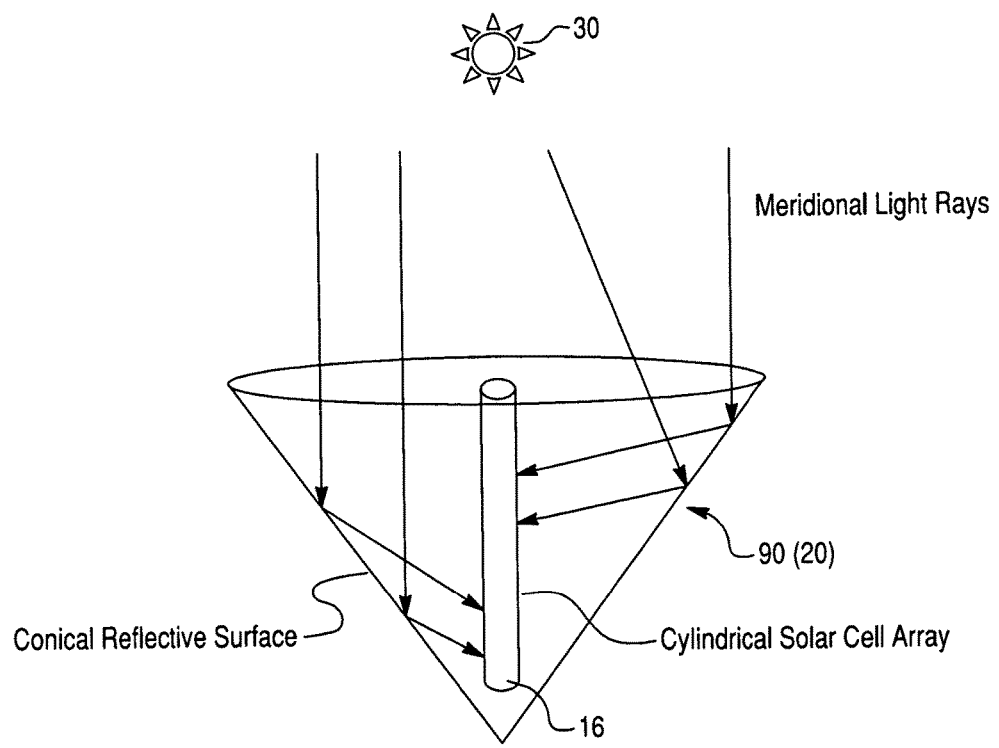
FIG. 8 is a side cross section view of a local concentrator apparatus with a conical mirror according to an embodiment of the invention.
Figure 10A:
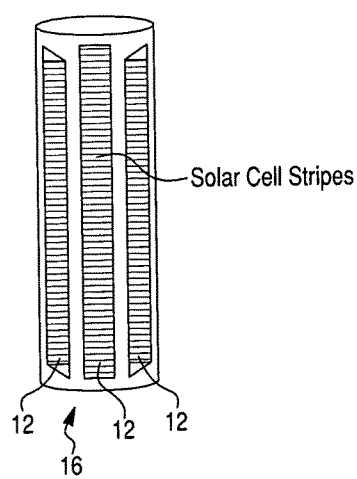
FIG. 10A is a perspective view of a strip having a circular cross-section with PV cell array for use with the local concentrator apparatus of FIG. 8 or FIG. 9 according to an embodiment of the invention.
Figure 10B:
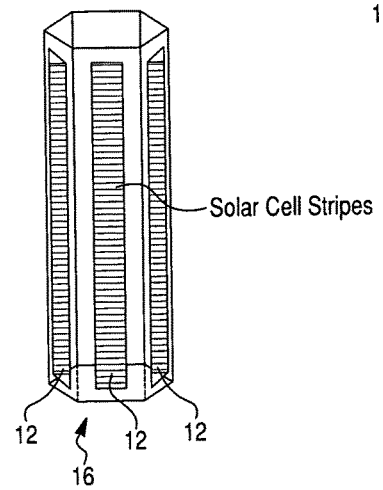
FIG. 10B is a perspective view of a strip having a hexagonal cross-section with PV cell array for use with the local concentrator apparatus of FIG. 8 or FIG. 9 according to an embodiment of the invention.

FIG. 8 and FIGS. 10A-10B illustrate an embodiment of a local concentrator apparatus where the optical element 20 for concentrating light is a conical reflector 90, with strip, and cells coated inside reflector 90. The apparatus in FIG. 8 includes an array 12 of PV cells (See FIGS. 10A-10B) on the strip 16. The sunlight rays at different angles are reflected along a cylindrical cross-section as shown in FIG. 8. The PV cells are disposed in an array 12 on the surface of the strip 16 as shown in FIGS. 10A and 10B. As the sun 30 traverses the sky during the day, the angle of light incident on the conical reflector 90 changes. This leads to reflection and concentration of light at different locations, i.e., different focus points, along the strip 16 surface as the sun 30 traverses the sky. By employing a linear array 12 of PV cells 14 on the surface of the strip 16, a tracking free system is obtained. The conical reflector could be made by, for example, welding triangular shaped flat reflectors to fit the shape of a cone.

Figure 10C:
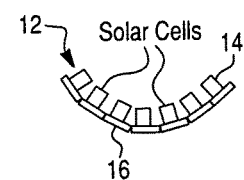
FIG. 10C is a side view of a strip with PV cell array for use with a local concentrator apparatus having spherical or hemispherical lenses according to an embodiment of the invention.

FIGS. 10A and 10B illustrate the strip 16 with a PV cell array 12 disposed on the surface of the strip 16. FIG. 10A illustrates an embodiment where the strip has a circular cross section, while the embodiment as shown in FIG. 10B illustrates an embodiment where the strip has a hexagonal cross section. FIG. 10C illustrates a strip with discrete cells 14 suitable for a spherical or hemispherical lens based systems.

Figure 9:
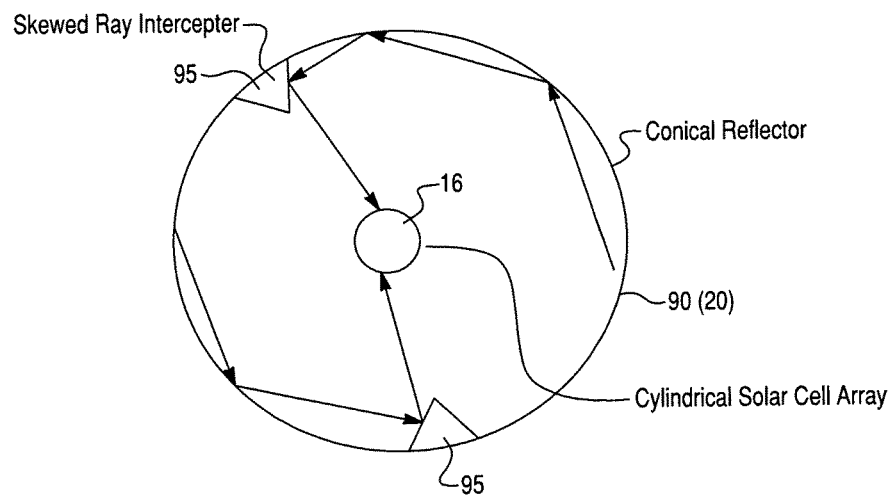
FIG. 9 is a top view of a local concentrator apparatus with a conical mirror and skewed ray interceptors according to an embodiment of the invention.

FIG. 9 illustrates an embodiment of a local concentrator apparatus where the optical element 20 is a conical reflector 90, with the addition of skewed ray interceptors 95 to capture oblique angle light in addition to the meridonal ray light captured from the conical reflector 90. The embodiment of FIG. 9 is similar to the embodiment of FIG. 8 with the addition of the skewed ray interceptors 95. Referring back to FIG. 8, which is an illustration in side cross-section, the depicted incident light are meridional rays from the sun. These rays have a plane of incidence and reflection intercepting the strip 16 surface where PV cells 14 are disposed. Hence the meridonal rays are collected by the PV cells 14 after reflection from the reflection surface of the conical reflector 90. With respect to FIG. 9, for those rays which are falling at an oblique angle on the conical reflector (skewed rays as shown in FIG. 9), the oblique rays travel along the conical surface. The skewed ray interceptors 95 are arranged to divert these oblique rays to the strip 16 in the center of the cone. The skewed ray interceptors 95 may be triangular shaped reflecting surfaces, for example.

Figure 11A:
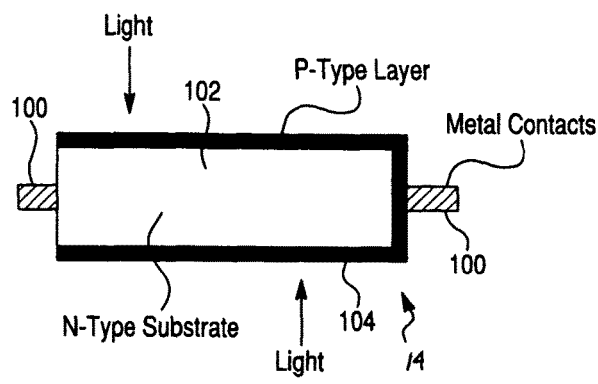
FIGS. 11A and 11B are a side cross-sectional view of PV doubled sided illumination cells for use with a local concentrator apparatus according to embodiments of the invention.
Figure 11B:
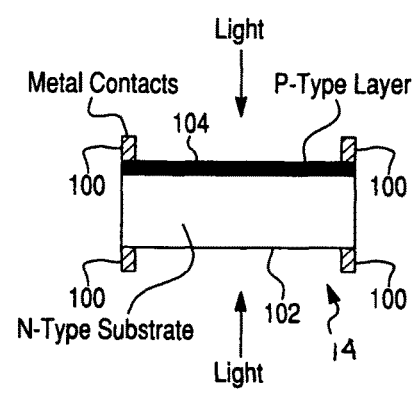

FIGS. 11A and 11B illustrate PV cells 12 for double sided illumination type PV cells, such as for use in the apparatuses of the embodiments of FIGS. 5 and 7, for example. The cells 14 may be simple semiconductor p-n junctions. The cells 14 include a p-type semiconductor layer 104 and an n-type semiconductor layer 102 to form a junction at their boundary. Alternatively, semiconductor layer 104 could be n-type layer and semiconductor layer 102 could be p-type layer. The cells 12 also include metal contacts 100 to provide electrical contact to the semiconductor material. The semiconductor material may be silicon, for example. In the cells, the area between the contact metal contacts is transparent to light, and the metal contacts 100 are arranged to allow sufficient light between the contacts. The cells in FIGS. 11A and 11B absorb light from both top and bottom surfaces, as well as edge surfaces, wherever there is no metal coverage, and are known as double sided illuminated devices. Further, any below bandgap light that is not absorbed by the PV cell is transmitted through the device.

Figure 12A:
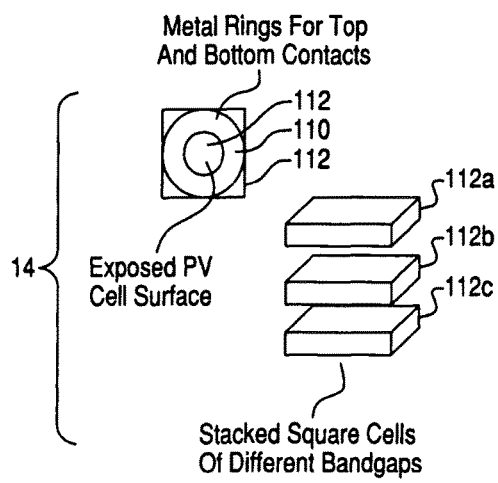
FIGS. 12A and 12B are exploded schematics of stacked PV cells for use with a local concentrator apparatus according to embodiments of the invention.
Figure 12B:
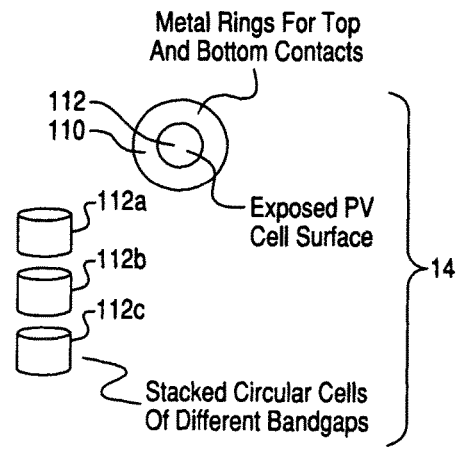

FIGS. 12A and 12B are exploded schematics illustrating stacked PV cells 14 fabricated using different bandgap semiconductor materials, where FIGS. 12A and 12B illustrate cells with rectangular and circular cross-section, respectively. The cells 14 include metal contacts 110 for both the top and bottom of the cells 14, where the contacts 110 are ring shaped. The cells 14 also include different semiconductor materials 112a, 112b, 112c, each with a different bandgap. The different semiconductor materials 112a, 112b, 112c are stacked one upon another in the cells 14. The stacked PV cells converts a larger portion of the solar radiation as compared to a single junction PV cell and hence will boost the power conversion efficiency of the solar panel. Since the individual PV cells may be smaller in area (0.1-1 mm$^2$, for example), it is possible to provide metal contacts on the p-type and n-type sides using ring configuration as shown in FIGS. 12A and 12B.

The local concentrator apparatus design enables the manufacturing of very high efficiency systems. Stacked PV cells with semiconductor materials having different bandgaps can be used instead of the single bandgap cells. The stacked PV cells will further boost the efficiencies of the system. Since the individual cells may have a small areas (0.1-1 mm$^2$), it is possible to provide metal contacts on the p-type and n-type sides using ring configuration as shown in FIGS. 12A and 12B.

While the discussion has described the present invention in the context of solar light concentration and power production, many other applications can be envisioned. Additionally, the use of translucent spherical balls to locally concentrate light allows the light to enter the sphere from many different angles and therefore different sources simultaneously. For example the source could be direct light from the sun as well as diffused light reflected off surfaces such as nearby buildings. Furthermore the source of light concentrated could be from outside the visible spectrum of the electro-magnetic radiation spectrum (such as infrared and ultraviolet radiation).

While the above embodiments describe an apparatus without the optical elements tracking the sun as the sun traverses the sky during the day, in a less preferred embodiment, the optical elements may be driven to track the sun. The optical elements in this case may be spherical lenses, for example. The low cost and readily available spherical lenses provide that the system is low cost.

What is claimed:

1. An apparatus comprising:
an array of double-sided illuminated photovoltaic cells arranged along an elongated strip; and
one or more optical elements arranged to direct and optically concentrate sunlight onto the photovoltaic cells such that a position where the directed sunlight impinges onto the strip follows a path moving along the strip without the one or more optical elements tracking the sun as the sun traverses the sky during the day, wherein the one or more optical elements direct and concentrate sunlight onto a first side of the array of photovoltaic cells, and
an auxiliary array of optical elements arranged to direct sunlight onto a second side of the array of photovoltaic cells, the second side being opposite to the first side, wherein a number of photovoltaic cells included in the array of photovoltaic cells is greater than a number of optical elements arranged to direct and optically concentrate sunlight onto the photovoltaic cells.

2. The apparatus of claim 1, wherein the one or more optical elements is an array of optical elements.

3. The apparatus of claim 2, wherein the array of optical elements comprises an array of spherical or hemispherical concentrating lenses.

4. The apparatus of claim 3, wherein the concentrating lenses comprise a high refractive index material or glass marbles.

5. The apparatus of claim 3, wherein the concentrating lenses comprise hollow spheres of an optically transparent solid filled with a high refractive index liquid.

6. The apparatus of claim 5, wherein the high refractive index liquid comprises a material comprising at least one of water, oil, glycerol, acetone, or methanol;
and wherein the optically transparent solid comprises a material comprising glass or plastic.

7. The apparatus of claim 2, wherein the concentrating lenses comprise optically clear composite solids, at least one of a mixture of glass and plastic, high refractive index solid dispersed in liquid, or glass embedded with air bubbles.

8. The apparatus of claim 3, wherein the concentrating lenses comprise a structure with multiple layers, each layer having a different refractive index, or a structure having concentric hollow layers filled with liquids having different indices of refraction.

9. The apparatus of claim 3, wherein the concentrating lenses comprise an anti-reflection coating on the lens surface.

10. The apparatus of claim 1, wherein the one or more optical elements comprise one or more concentrating mirrors.

11. The apparatus of claim 10, wherein the one or more concentrating mirrors comprise more than one concentrating mirrors, one or more parabolic mirrors or one or more conical mirrors.

12. The apparatus of claim 11, further comprising one or more skewed ray interceptors with mirrored surfaces arranged to direct oblique rays to the strip.

13. The apparatus of claim 1, wherein the auxiliary array of optical elements comprises an array of auxiliary mirrors.

14. The apparatus of claim 13, wherein the one or more optical elements comprises an array of concentrating mirrors, one or more parabolic mirrors or one or more conical mirrors.

15. The apparatus of claim 3, further comprising a grid mesh arranged to support the concentrating lenses.

16. The apparatus of claim 14, further comprising a grid mesh arranged to support the mirrors.

17. The apparatus of claim 1, wherein the one or more optical elements concentrate the sunlight onto the photovoltaic cells with a concentration ratio of about less than 100.

18. The apparatus of claim 1, further comprising: a plurality of heat sinks arranged to be in thermal contact with the photovoltaic cells so as to draw heat from the photovoltaic cells.

19. The apparatus of claim 1, wherein the photovoltaic cells comprise a single bandgap material, and wherein the single bandgap material comprises at least one of silicon, germanium, compound semiconductors, or organic semiconductors.

20. The apparatus of claim 1, wherein the photovoltaic cells comprise stacked photovoltaic cells, each stacked photovoltaic cell comprising a plurality of materials, each with different bandgaps.

21. The apparatus of claim 20, wherein the stacked photovoltaic cells comprise ring shaped metal contacts on either end of the stacked photovoltaic cells.

22. The apparatus of claim 1, wherein the elongated strip has a width between about 1 to 5 mm and a length between about 0.5 to 5 cm.

23. The apparatus of claim 1, wherein the elongated strip has a curved surface, and the elongated strip has a cylindrical or hexagonal cross-section.

24. The apparatus of claim 1, wherein the one or more optical elements are arranged to direct and optically concentrate sunlight onto the photovoltaic cells such that the position that the directed sunlight impinges onto the strip follows a path moving along the strip without the optical elements tracking the sun as the sun traverses the sky during the day during a portion of daylight hours.

25. The apparatus of claim 1, wherein the one or more optical elements are arranged to direct and optically concentrate sunlight onto the photovoltaic cells such that the position that the directed sunlight impinges onto the strip follows a path moving along the strip without the optical elements tracking the sun as the sun traverses the sky during the day during an entirety of daylight hours.

26. The apparatus of claim 1, wherein the one or more optical elements are arranged to direct and optically concentrate direct or indirect sunlight onto the photovoltaic cells.

27. The apparatus of claim 1, wherein the array of optical elements comprises an array of concentrating lenses, the concentrating lenses comprising a solid transparent high refractive index cylindrical rod or a hollow cylindrical solid tube filled with liquid.

* * * * *